United States Patent
Lipowski et al.

[11] Patent Number: 5,828,955
[45] Date of Patent: Oct. 27, 1998

[54] NEAR DIRECT CONVERSION RECEIVER AND METHOD FOR EQUALIZING AMPLITUDE AND PHASE THEREIN

[75] Inventors: Joseph T. Lipowski, Boxborough; Dennis Michael Cleary, Clinton, both of Mass.

[73] Assignee: Rockwell Semiconductor Systems, Inc., Newport Beach, Calif.

[21] Appl. No.: 521,568

[22] Filed: Aug. 30, 1995

[51] Int. Cl.$^6$ .................................................. H04B 1/30
[52] U.S. Cl. ........................ 455/324; 455/86; 455/304; 329/306; 375/329
[58] Field of Search ............................... 455/84, 86, 143, 455/189.1, 205, 207, 209, 214, 263, 276.1, 296, 303, 304, 313, 314, 323, 324, 336, 337; 375/344, 345, 329; 329/304, 306, 310

[56] References Cited

U.S. PATENT DOCUMENTS

| | | | |
|---|---|---|---|
| 4,373,205 | 2/1983 | Mizota | 455/86 |
| 4,464,770 | 8/1984 | Maurer et al. | 375/119 |
| 4,618,967 | 10/1986 | Vance et al. | 375/80 |
| 4,633,315 | 12/1986 | Kasperkovitz | 358/188 |
| 4,653,117 | 3/1987 | Heck | 455/209 |
| 4,713,563 | 12/1987 | Marshall et al. | 307/490 |
| 4,905,307 | 2/1990 | Frank | 455/209 |
| 4,908,532 | 3/1990 | Chadwick | 307/512 |
| 4,944,025 | 7/1990 | Gehring et al. | 455/207 |
| 4,953,185 | 8/1990 | Chung | 375/97 |
| 4,979,230 | 12/1990 | Marz | 455/3 |
| 5,003,621 | 3/1991 | Gailus | 455/209 |
| 5,052,050 | 9/1991 | Collier et al. | 455/296 |
| 5,126,682 | 6/1992 | Weinberg et al. | 329/304 |
| 5,157,343 | 10/1992 | Voorman | 329/319 |
| 5,159,710 | 10/1992 | Cusdin | 455/304 |
| 5,222,144 | 6/1993 | Whikehart | 381/15 |
| 5,230,011 | 7/1993 | Gielis et al. | 375/97 |
| 5,230,099 | 7/1993 | Loper | 455/324 |
| 5,249,203 | 9/1993 | Loper | 375/97 |
| 5,251,218 | 10/1993 | Stone et al. | 370/120 |
| 5,263,194 | 11/1993 | Ragan | 455/316 |
| 5,440,587 | 8/1995 | Ishikawa et al. | 375/332 |

*Primary Examiner*—Reinhard J. Eisenzopf
*Assistant Examiner*—Lee Nguyen
*Attorney, Agent, or Firm*—Fish & Richardson P.C.

[57] ABSTRACT

A low cost, high performance near direct conversion FM receiver having a single local oscillator is configured to equalize in-phase and quadrature-phase IF signals. The receiver includes a downconverter and a processor. The downconverter receives an RF signal and downconverts the RF signal to an in-phase IF signal ($IF_I$) and a quadrature-phase IF signal ($IF_Q$). The processor digitizes $IF_I$ and $IF_Q$, corrects these signals so that they are substantially equal in magnitude and substantially 90° out of phase, and then downconverts the IF signals to baseband signals (I, Q).

34 Claims, 5 Drawing Sheets

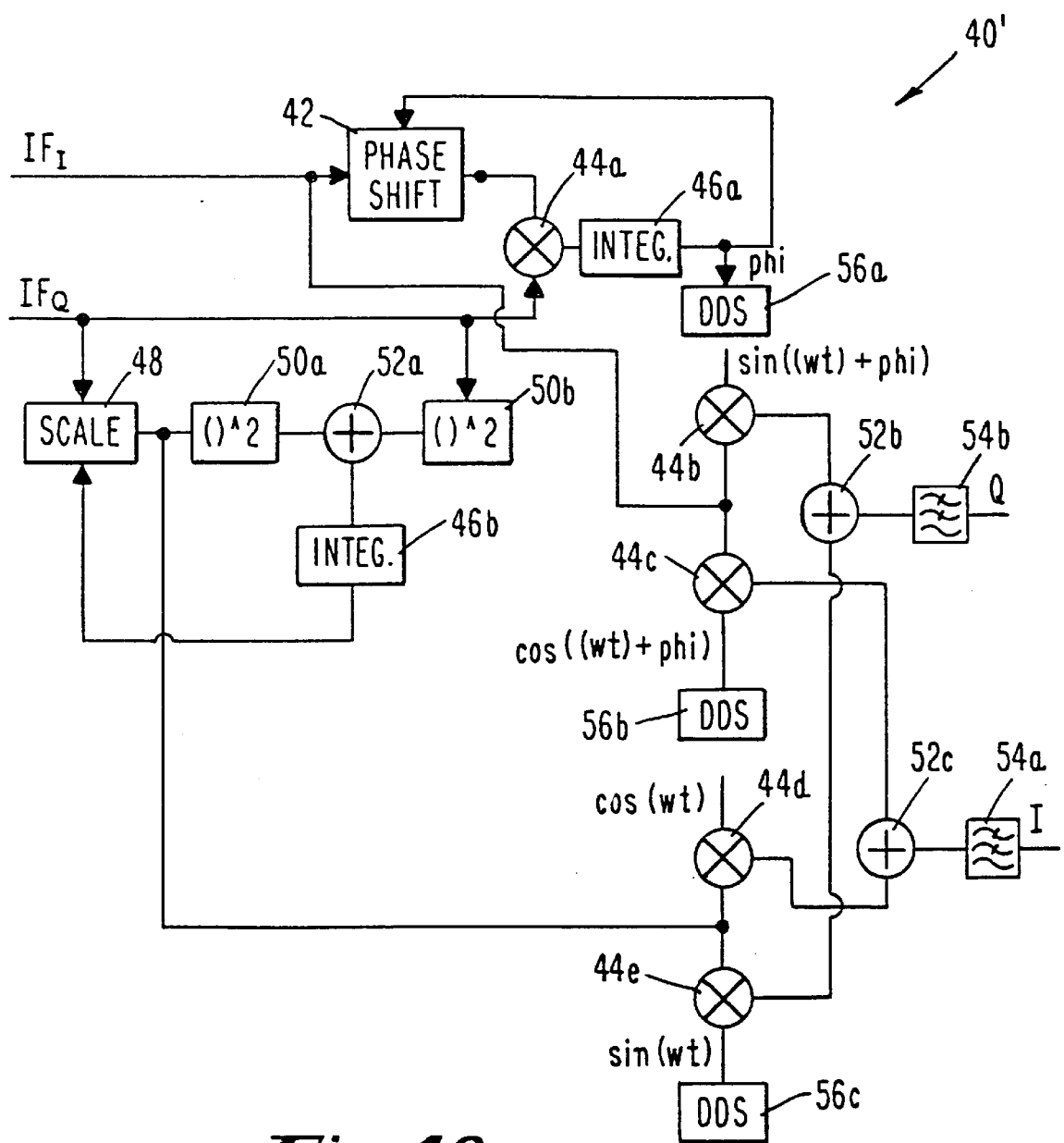
_Fig. 4C_
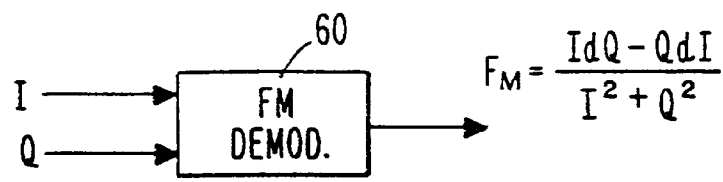
_Fig. 5_

NEAR DIRECT CONVERSION RECEIVER AND METHOD FOR EQUALIZING AMPLITUDE AND PHASE THEREIN

FIELD OF THE INVENTION

The present invention relates generally to the field of radio communications, and more particularly to a near direct conversion radio frequency (RF) receiver. One presently preferred embodiment of the invention relates to a near direct conversion receiver employing a quadrature mixer for downconverting signals in the cellular band (approximately 824 to 849 MHz) and to a digital signal processor (DSP) for equalizing the amplitude and phase of the in-phase and quadrature signals (I and Q) generated by the mixer.

BACKGROUND OF THE INVENTION

The following discussion of the background and prior art relevant to the present invention is illustrative of exemplary applications of the invention and certain problems associated with the prior art that can be avoided with the invention. This discussion is not intended to imply that the usefulness of the invention is limited in any particular manner. Accordingly, except where they are expressly so limited, the scope of protection of the claims at the end of this specification is not intended to be limited to the particular embodiments and applications described herein.

I. Cellular System Employing a Micro-Basestation

One exemplary application of the present invention is in a receiver or transceiver of a micro-basestation 10 in a cellular environment of the type depicted in FIG. 1. The micro-basestation 10 is coupled via a phone line to a mobile telephone switching office (MTSO) 12, which is coupled via phone lines (e.g., T1 lines) to a set of cell sites, represented by cell site 14, and a set of telephones represented by telephone 16. The micro-basestation 10 communicates with mobile units (i.e., cellular or mobile telephones) 18 and 18' by receiving RF signals from the mobile units in a first set of predefined wireless channels (indicated by dash line 22) and transmitting RF signals in a second set of predefined wireless channels (indicated by dash line 24).

The micro-basestation 10 may be situated in a subscriber's home or office. It permits the subscriber to avoid some of the costs in using the wireless channels when he receives or originates a call with his cellular phone and he is within a predefined transmission and reception range of the micro-basestation. This predefined range is a function of the strength of the transmitted and received signals and the gain of the antennae and electronic circuitry of the micro-basestation and mobile units.

Assume mobile unit 18 is within the predefined range of the micro-basestation and mobile unit 18' is not within the predefined range. An incoming call originated by the telephone 16 and directed to mobile unit 18 would be routed through the MTSO 12 to the micro-basestation 10, and from the micro-basestation 10 to the mobile unit 18, as indicated by a communication path 20 in FIG. 1. In this manner, use of the cell site 14 and the costs associated therewith are avoided. An outgoing call originated by mobile unit 18 would be handled in a similar manner. Therefore, in this scenario, mobile unit 18 acts like a conventional cordless phone and may be billed at a land line rate and not the higher cellular rate necessitated by the relative scarcity of wireless channels. Moreover, the subscriber is not required to have separate mobile and cordless or conventional telephones and separate telephone numbers.

As indicated by a communication path 20' in FIG. 1 when the mobile unit 18' is out of range of the micro-basestation 10, calls established between telephone 16 and mobile unit 18' are routed through the cell site 14 over channels 22' or 24'. These calls typically cost subscribers more than calls routed via communication path 20 because they require the use of a wireless channel.

The present invention may be used as a suitable transceiver in the micro-basestation 10. In this example, the predefined channels on which the micro-basestation receives RF signals span the frequency band of 824.040 to 848.970 MHz, and the predefined channels on which the micro-basestation transmits RF signals span the frequency band of 869.040 to 893.970 MHz. These frequency bands, which are specified in the AMPS standard EIA/TIA-IS-54-B, are occupied by cellular or wireless channels having center frequencies ($f_{c_n}$, n=1 to N) spaced 30 kHz apart from one another. (The mobile unit transmission channels are depicted in FIG. 3A, discussed below.) The RF signals in this example are FM signals, and their spectra occupy a bandwidth of approximately 15 to 20 kHz and contain symmetrical sidebands on either side of the center frequency of a given channel.

Background information about RF receivers generally and receivers particularly constructed and arranged to receive FM signals will now be provided.

II. Superheterodyne and Direct Conversion Receivers Generally

Most RF receivers comprise one or more intermediate frequency (IF) stages permitting the filtering and amplification of the received signal at fixed intermediate frequencies that are significantly greater than zero (i.e., the spectra of the IF signals are shifted a relatively large distance from the baseband spectrum). Superheterodyne receivers downconvert the incoming radio signal to one or more IF bands in which amplification and frequency selection are performed more easily than at the carrier frequency of the received RF signal. Typically, the carrier frequency is downconverted two or three times in successive demodulation stages. The intermediate frequency is selected at each stage with a bandpass filter. One disadvantage of superheterodyne receivers is that they are difficult to miniaturize because they often require high-Q crystal or ceramic bandpass filters not easily integrated in monolithic form. Superheterodyne receivers also present problems with cross-over spurious responses, which can cause interference and related design difficulties, and image rejection.

The direct conversion approach is an alternative to the superheterodyne approach. Direct conversion receivers offer advantages such as not being affected by cross-over spurious responses, not being subject to image rejection problems, and not requiring the often bulky and expensive bandpass filters typically employed in superheterodyne receivers (although lowpass filters operating at audio frequencies are required). Moreover, direct conversion receivers can operate with only a single local oscillator (LO) signal rather than multiple LO signals for the respective IF stages of some superheterodyne receivers. Direct conversion receivers also provide a good potential for miniature implementations (e.g., VLSI) since most of the receiver components (i.e., the lowpass filters, audio amplifiers, analog-to-digital convertors (ADCs), and signal processor or demodulator) consist of digital or audio frequency circuitry.

Typically, in a direct conversion receiver, incoming RF signals are split into a pair of RF components ($RF_I$ and $RF_Q$), which are ideally equal in amplitude and in phase with each other. These RF components are then mixed with separate injection signals having the same frequency as that of the carrier but separated in phase by 90°. I and Q baseband component signals are thereby formed. These signals may be independently filtered and amplified at audio frequencies on a pair of separate signal channels. The I and Q components formed as a result of the mixing process allow the signal to be conveniently and accurately demodulated by a suitable signal processor or demodulator.

Direct conversion receivers have a number of drawbacks that particularly limit their use in processing FM and SSB signals. For example, direct conversion receivers typically include several amplifiers subject to automatic gain control (AGC) to preserve linearity so that the modulated signal is accurately recovered when the I and Q signals are recombined. One problem with this approach is that DC offsets inherent in the amplifiers and other elements of the receiver circuit can cause the amplifiers to saturate. One method for overcoming this problem is to AC couple the receiver elements to block their DC offsets. However, the AC coupling creates a DC notch around zero frequency that dampens the low frequency components. The portion of the modulated signal centered around the carrier frequency is thus lost when the modulated signal is translated to the zero IF. For signal modulation formats such as FM and SSB, the DC notch causes distortion, since the notch frequencies contain signal information. Moreover, with automatic gain control, the rest of the signal is overamplified to compensate for the lost signal within the notch, which also distorts the received signal. For these and other reasons, direct conversion receivers of the kind described above are primarily used where a loss of the modulated signal portion about zero frequency is not critical, such as where the RF signal is digitally modulated (e.g., with frequency shift keying (FSK)).

III. Direct Conversion FM Receivers

Direct conversion FM receivers (as distinguished from direct conversion receivers for other kinds of modulated signals) are well known. See, e.g., U.S. Pat. No. 5,003,621, Mar. 26, 1991, "Direct Conversion FM Receiver" (Gailus); U.S. Pat. No. 4,944,025, Jul. 24, 1990, "Direct Conversion FM Receiver With Offset" (Gehring); U.S. Pat. No. 4,653,117, Mar. 24, 1987, "Dual Conversion FM Receiver Using Phase Locked Direct Conversion IF" (Heck); and U.S. Pat. No. 5,249,203, Sep. 28, 1993, "Phase And Gain Error Control System For Use In An I/Q Direct Conversion Receiver" (Loper).

In one example of a direct conversion FM receiver (sometimes called a "translating bandpass filter"), the received signal is translated from an incoming frequency to baseband, filtered and upconverted to an output frequency at which conventional FM demodulation takes place. In this approach, equal positive and negative frequency excursions about the RF carrier frequency result in corresponding equal frequency deviations in the baseband signal, but the polarity of the modulating (baseband) signal is ambiguous unless a phase reference is provided. The I and Q signal paths (which are ideally identical) are used to provide such a reference. In one prior art approach, the received RF signal is downconverted to baseband, low-pass filtered to remove the sum mixing products and adjacent channel signals, and then upconverted to an output frequency. The down- and up-conversion oscillators for one path are in phase quadrature with their counterparts in the other path, and the successive frequency conversions produce phase conversions between side bands of the signals in the two paths. The outputs of the two paths are then summed so that the side bands cancel in such a manner that the modulation polarity of the original RF signal is retained.

There are several problems that are inherent to the above-described approach to direct conversion FM receivers, including: (1) a need for reverse isolation to prevent the LO injection signal, which is at the same frequency as the received RF signal, from interfering with other receivers; (2) noise and DC offsets that make it difficult to achieve the low noise amplification and high gain necessary for adequate sensitivity; and (3) inadequate cancellation of mixing products causing an undesired beat note at twice the offset frequency and related distortion products at harmonics of the offset frequency. Heck discloses that the beat note can interfere with the demodulated audio output if it is in the audio band, that the lowpass filter bandwidth necessary to pass an FM signal increases as the offset frequency increases, and that it is difficult to achieve good selectivity with other than negligible offsets. For example, a low level beat note of about 20 kHz (due to a 10 kHz offset) would not be a significant problem in a broadcast application employing lowpass filters having a cutoff frequency of about 100 kHz, but would be a significant problem in a land-mobile application in which channel spacing could be as close as 12.5 kHz and the lowpass filter bandwidth must be narrower than one-half the channel spacing (e.g., 6 kHz) to separate adjacent channel signals from the desired channel signal.

Heck discloses the placement of amplification and limiting functions outside the dual I, Q signal paths at a nonzero intermediate frequency, and the use of AC coupling combined with translating the input signal to a small offset frequency in the range of 10 to 100 Hz, to avoid the problems of DC offset. This small translation is an attempt to fit the DC notch between the line spectra of the FM signal, where each line is separated by the modulating signal frequency range. Heck's preferred embodiment is a dual conversion FM receiver using a phase locked direct conversion IF that up-converts the baseband signal to the non-zero IF for amplification, limiting and demodulation. The disclosed receiver includes a quadrature baseband mixing section followed by an up-conversion section that amplifies and limits the up-conversion signal.

Gailus discloses a direct conversion FM receiver including an analog section comprising a pair of local oscillators and a quadrature mixer, and a digital section comprising analog-to-digital converters, notch filters at DC (zeros at DC), a digitally controlled phase lock loop, and a frequency offset generator. The quadrature mixer outputs an analog in-phase baseband signal and an analog quadrature baseband signal, which are digitized and filtered by the notch (zero at DC) filters to eliminate desensing caused by DC offsets. The digital I and Q signals are demodulated and digitally filtered to recover digital modulation information, and then the baseband signal is digitally remodulated to a frequency offset from that of the original RF signal.

One problem presented by the FM receivers disclosed by Heck and Gailus is that they are relatively complex and expensive. For example, such receivers feed the downconverted signal back into the upper conversion stages, adding to the complexity and cost of the receiver. Further, the sequential down- and up-conversion stages require multiple local oscillators, which increase the cost and complexity of the receiver.

In addition, FM receivers employing quadrature mixers present a number of other problems, particularly with respect to amplitude and phase errors introduced by the use of separate signal paths for the I and Q signal components. Variations between the I, Q signal channels that commonly occur as a result of changes in temperature, frequency and other operational parameters result in gain and phase mismatches, which produce distortion products in the output of the receiver and severely limit the performance of the receiver.

Loper discloses a direct conversion receiver employing a signal processing algorithm according to which digitized I and Q baseband signals are used to derive I' and Q' signals. The I', Q' signals relate to twice the phase angle defined by the I and Q baseband component signals. The I' and Q' signals are processed to remove DC components that reflect gain and phase errors. The Loper patent discloses that the error signal resulting from the differencing of phase angles based on I and Q and I' and Q' can be used to detect phase and gain errors as a function of the original phase angle defined by the I and Q signals. The phase and gain errors are employed to adjust the Q baseband component and to correct the relationship between the original I and Q components. This algorithm purportedly provides I and Q baseband component signals substantially free from gain and phase errors due to hardware mismatches between the signal channels. However, the disclosed algorithm appears to be relatively complex and costly to implement.

SUMMARY OF THE INVENTION

A primary object achieved by the present invention is to provide a low cost, high performance receiver, and a more specific object achieved by the invention is to provide a low cost, high performance FM receiver having a single LO and improved means for equalizing I and Q. Another object achieved by the invention is to provide a low cost, high performance transceiver.

The invention may be employed in a variety of applications, including in a receiver or transceiver of a micro-basestation employed in connection with a cellular telephone system; in a mobile transceiver such as mobile cellular unit situated in a car or truck; and in cellular telemetry, which relates to the use of a cellular system and a micro-basestation, e.g., by a utility company, in monitoring conditions within the home, such as energy consumption within a given period. Depending on the particular application, it will be more or less important to embody the invention in a miniature form. Therefore, the invention's novel combination of analog and digital circuitry (as described below), which lends itself to low cost production and/or miniaturization more readily than many prior art approaches, is particularly advantageous.

One presently preferred embodiment of the invention is a receiver comprising downconversion means and processing means. The downconversion means receives an RF signal and downconverts the RF signal to an in-phase IF signal ($IF_I$) and a quadrature-phase IF signal ($IF_Q$). The processing means digitizes $IF_I$ and $IF_Q$, corrects these signals so that they are substantially equal in magnitude and substantially 90° out of phase, and then downconverts the IF signals to baseband signals (I, Q). In the presently preferred embodiment, there is no feedback from the digital section to the analog front end.

In the presently preferred embodiment, the processing means comprises a pair of analog-to-digital converters for digitizing $IF_I$ and $IF_Q$, and a digital signal processor (DSP) for correcting the digitized IF signals and downconverting the digitized IF signals to the baseband signals. The DSP preferably comprises phase correcting means and amplitude correcting means.

The phase correcting means of the preferred embodiment includes a phase shifter for phase shifting at least one of the IF signals and providing phase shifted representations of the at least one of the IF signals. A multiplier coupled to the phase shifter multiplies the IF signals and provides product signals representing products of the IF signals. An integrator sums the product signals, provides sum signals representing cumulative sums of the product signals, and feeds the sum signals back to the phase shifter. The phase shifter shifts the phase of the at least one of the IF signals to minimize any error in the quadrature-phase relationship between $IF_I$ and $IF_Q$.

The amplitude correcting means of the preferred embodiment comprises scaling means and summing means. The scaling means adjusts the magnitude of at least one of the IF signals; and the summing means provides a sum signal representative of the sum of a difference, if any, in the magnitudes of the IF signals. The summing means feeds the sum signal back to the scaling means, and the scaling means adjusts the magnitude of the at least one of the IF signals so as to minimize any difference in the magnitudes of the IF signals.

In the presently preferred embodiment, the DSP also includes a complex multiplier for downconverting the IF signals to the baseband signals (I, Q).

In one exemplary application of the present invention, the receiver is constructed and arranged to receive FM signals, and includes an FM demodulator or discriminator for providing a demodulated baseband signal. A preferred FM discriminator is one that generates a demodulated baseband signal (referred to as "FM") according to the equation:

$$FM = \frac{IdQ - QdI}{I^2 + Q^2}.$$

The present invention is particularly suited for use in combination with this kind of discriminator because the receiver does not generate DC offset errors in the I and Q signals, which if present would have to be corrected.

In the exemplary embodiment, the RF signal is downconverted to an IF in the range 10–20 kHz, and preferably to an IF of approximately 15 kHz (i.e., one-half the channel spacing of a cellular signal transmitted by a mobile phone).

The present invention may also be embodied in a transceiver. A transceiver in accordance with a preferred embodiment of the invention is employed to receive first radio frequency (RF) signals in a first set of frequency channels and transmit second set of RF signals in a second set of frequency channels without the use of a diplexer, which, if used, would add significantly to the cost of the transceiver. A presently preferred embodiment of a transceiver in accordance with the invention comprises a receiver of the kind described above for downconverting the first set of RF signals; a transmitter for upconverting baseband signals to the second set of RF signals; a synthesizer coupled to the receiver and transmitter for providing a downconversion LO signal to the receiver and an upconversion LO signal to the transmitter; a first antenna coupled to the receiver for receiving the first RF signals; and a second antenna coupled to the transmitter for transmitting the second RF signals.

Other features of the invention are described below.

BRIEF DESCRIPTION OF THE DRAWINGS

FIG. 4C depicts an alternative embodiment of the DSP, which employs another embodiment of a complex multiplier.

FIG. 5 depicts an example of an FM demodulator or discriminator of the type that may be employed in combination with a receiver in accordance with the present invention.

DETAILED DESCRIPTION OF PREFERRED EMBODIMENTS

Figure 1:
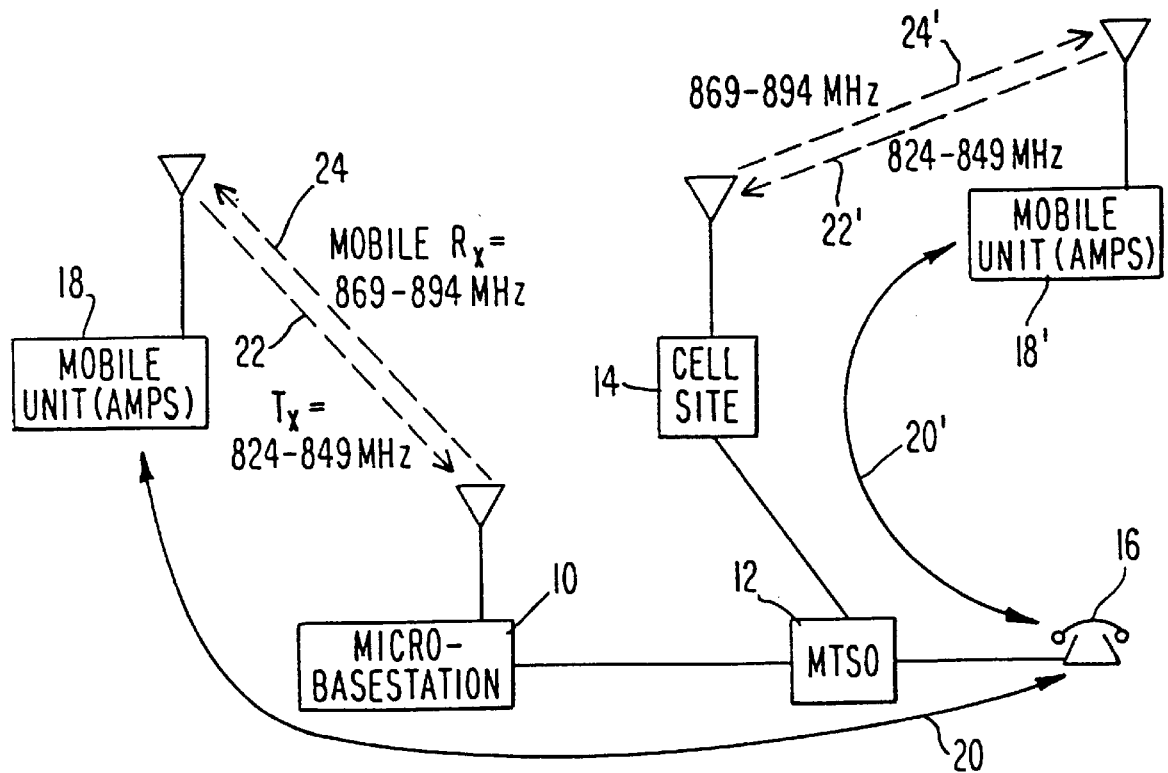
FIG. 1 schematically depicts a cellular system comprising a micro-basestation, which is an exemplary application of a receiver in accordance with the present invention.
Figure 2:
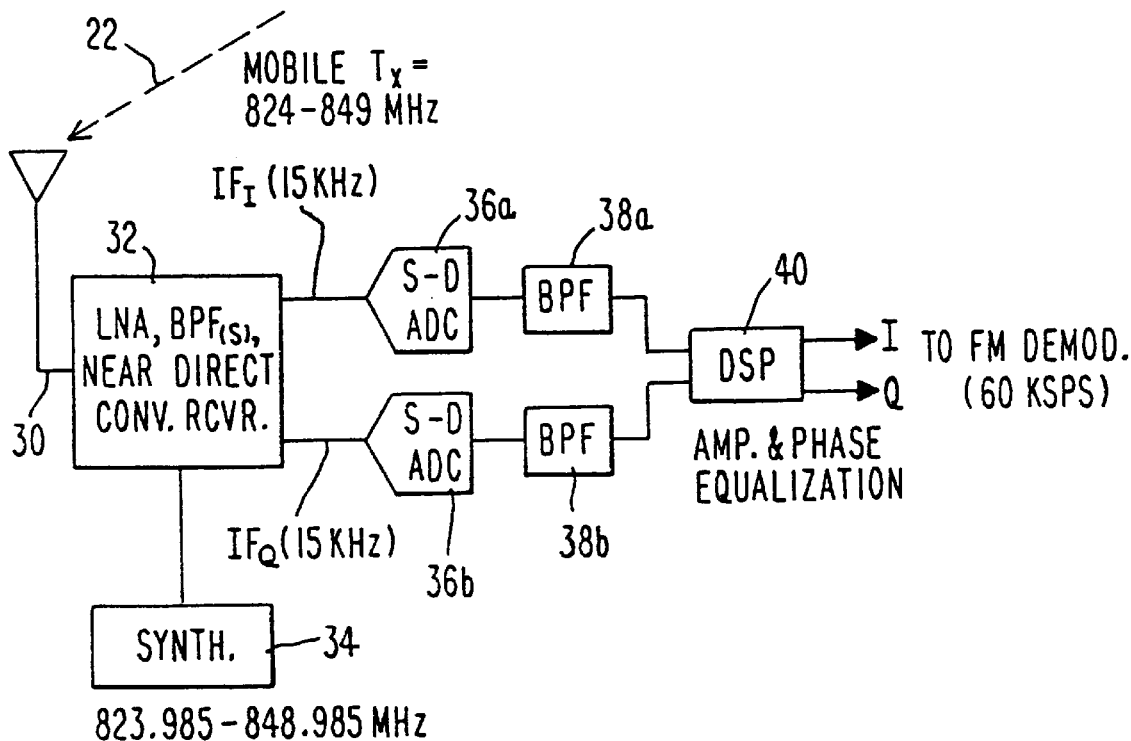
FIG. 2 is a partial block diagram of a receiver in accordance with the present invention.

FIG. 2 is a partial block diagram of an FM receiver in accordance with the present invention. As shown, the inventive receiver comprises an antenna 30 specifically selected to detect RF signals transmitted by a mobile unit (or similar transmitter) in a wireless channel of a frequency band spanning approximately 824 to 849 MHz. The antenna 30 is coupled to a downconversion unit 32, comprising one or more low noise amplifiers (LNAs), band pass filters (BPFs), and a near direct conversion receiver or downconverter. A synthesizer 34 provides a local oscillator (LO) signal to the downconversion unit 32. The to signal is a frequency in the range of approximately 823.985 to 848.985 MHz. The downconversion unit 32 outputs (or generates, if you wish) is an in-phase intermediate frequency (IF) signal $IF_I$ and a quadrature-phase IF signal $IF_Q$. The IF signals are input to sigma-delta type analog-to-digital converters 36a, 36b, and to bandpass filters 38a and 38b, as shown. The outputs of the bandpass filters 38a, 38b are provided to a digital signal processor (DSP) 40, which performs amplitude and phase equalization as described below, and outputs baseband in-phase and quadrature-phase signals I and Q. The I and Q signals are input to an FM demodulator or discriminator, for example, of the type represented schematically in FIG. 5. When the system of FIG. 2 is employed in a microbasestation of the type discussed above and depicted in FIG. 1, the LO signal generated by the synthesizer 34 will be selected to set the IF at approximately 15 kHz, or about one half the channel spacing employed in the cellular system.

Figure 3A:
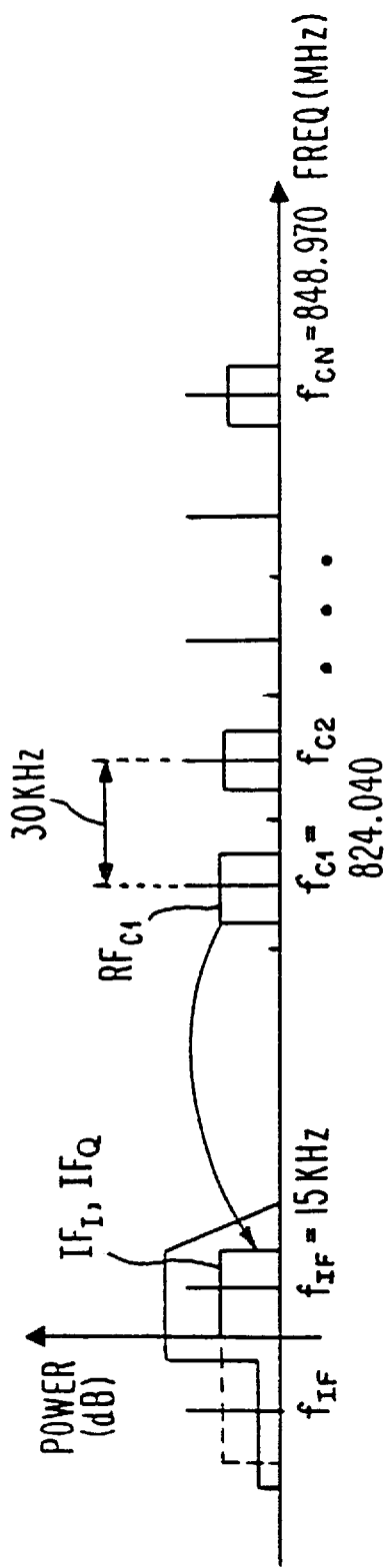
FIGS. 3A and 3B depict power spectra and are used in explaining the operation of a receiver in accordance with the present invention.

FIG. 3A is a simplified depiction of the power spectrum of a cellular system. As shown, the center frequencies $f_{c1}$ to $f_{cN}$ range from 824.040 MHz to 848.970 MHz with a spacing of 30 kHz. If, for example, the receiver of FIG. 2 is employed to receive an RF signal transmitted by a mobile unit on channel 1, or on the channel having a center frequency of 824.040 MHz, this signal, which occupies a bandwidth of approximately 16 kHz around the center frequency $f_{c1}$, is downconverted to the IF signals $IF_I$ and $IF_Q$ centered about 15 kHz. As indicated by FIG. 3A, the downconverted signals are lowpass filtered (to remove unwanted mixing products) and negative frequency image components are rejected and lowpass filtered (i.e., all negative images but the first are filtered; the first image is rejected). Such image rejection is well known to those skilled in the art, and is not explained in detail in this specification.

An alternative embodiment of the invention employs multiple downconversion stages (e.g., at least one downconversion step before the signal is downconverted to the 15 kHz IF signal). A reason for employing such multiple downconversion stages is that it makes it easier to eliminate certain second order effects, which is particularly useful in high interference environments. Thus, although the presently preferred embodiment of the invention employs a single downconversion stage for downconverting the RF signal to a frequency of approximately one-half the channel spacing (15 kHz in this case), the invention is not so limited.

Figure 3B:
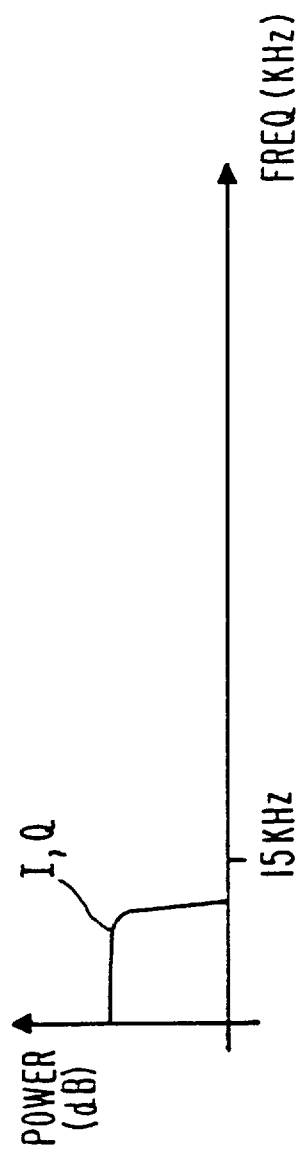

FIG. 3B is a simplified depiction of a power spectrum of the I and Q signals after the above-described downconversion and filtering have been performed. As shown, the negative frequency components have been substantially eliminated and higher frequency components have been filtered.

Figure 4A:
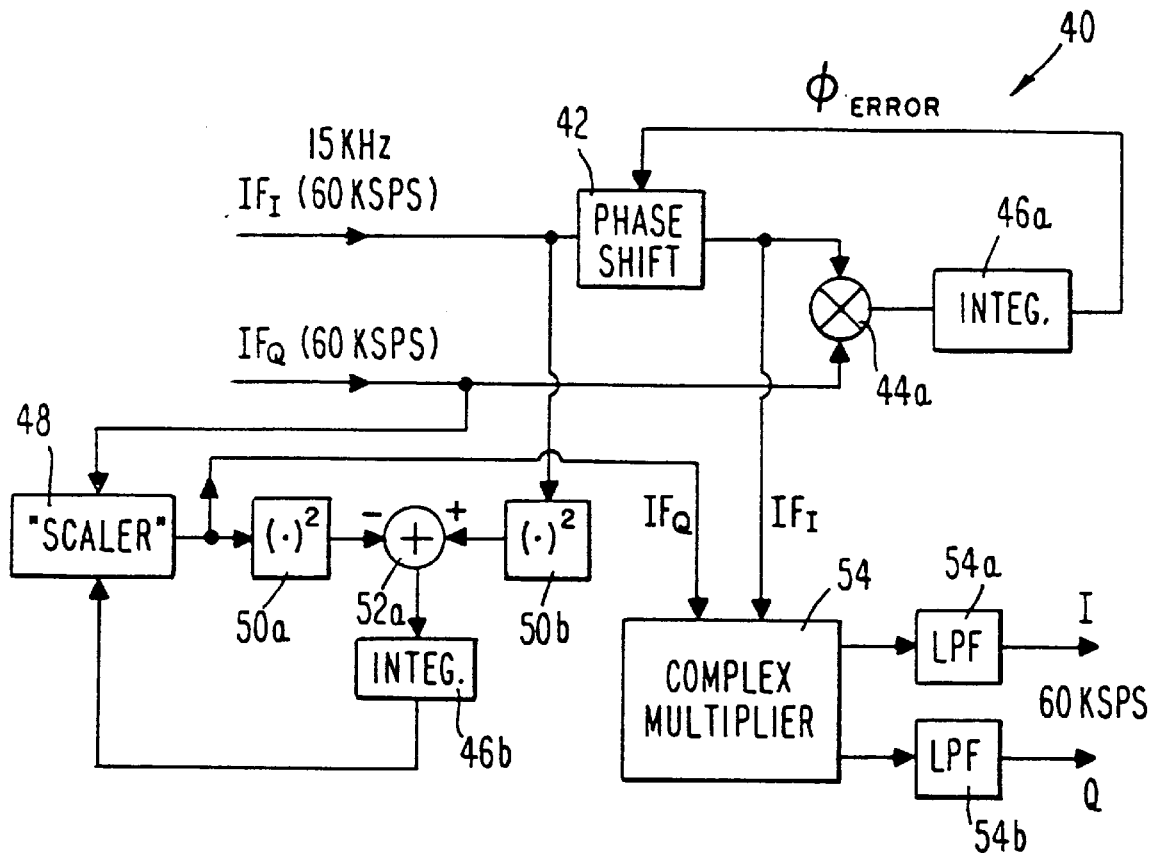
FIG. 4A schematically depicts a digital signal processor (DSP) for equalizing in-phase and quadrature-phase IF signals ($IF_I$ and $IF_Q$) in accordance with the present invention.

FIG. 4A depicts a presently preferred embodiment of the DSP 40. As shown, the IF signals $IF_I$ and $IF_Q$ (center frequency=15 kHz; sample rate=60 ksps) are input to a phase correcting means comprising a phase shifter 42, multiplier 44a, and integrator 46a. Those skilled in the art will recognize that the phase correcting means adjusts the phase of the $IF_I$ signal to minimize the phase error, defined as the amount by which $IF_I$ and $IF_Q$ are out of phase-quadrature. Thus, when $IF_I$ and $IF_Q$ are exactly 90° out-of-phase, the output of the multiplier 44a is zero and remains zero for as long as such a quadrature-phase relationship is maintained.

In a similar manner, the magnitude of $IF_Q$ is adjusted, or scaled, to ensure that the magnitudes of $IF_I$ and $IF_Q$ are identical. In this embodiment of the amplitude correcting means, $IF_Q$ is input via a scaler 48 to a first squaring element 50a, and $IF_I$ is input to a second squaring element 50b, as shown. The respective outputs of the squaring elements 50a, 50b are supplied to a summing device 52a, which computes the difference between the two squared values and supplies a difference signal to an integrator 46b as shown. The signal output by the integrator 46b is provided as a feedback signal to the scaler 48. The scaler 48 thereby attempts to minimize the difference, if any, between the magnitude of $IF_I$ and that of $IF_Q$. When the magnitudes of $IF_I$ and $IF_Q$ are identical, the output of the summing device 52a is zero and remains zero for as long as the two magnitudes remain identical.

The phase-corrected in-phase IF signal $IF_I$ is provided as one input to the complex multiplier 54 and the amplitude-corrected quadrature-phase signal $IF_Q$ is provided as a second input to the complex multiplier 54. The complex multiplier 54 processes these signals as described in greater detail below and generates I and Q output signals to a lowpass filters 54a and 54b respectively. The lowpass filters output in-phase and quadrature-phase baseband signals I and Q. These signals are provided at a rate of 60 ksps.

Figure 4B:
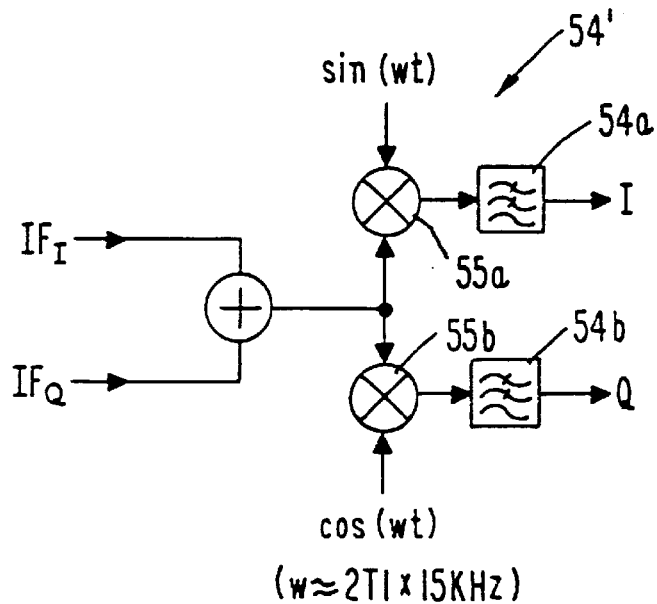
FIG. 4B depicts one preferred embodiment of a complex multiplier of the type that may be employed in the DSP of FIG. 4A.

One presently preferred embodiment 54' of the complex multiplier 54 is depicted schematically in FIG. 4B. As shown, the IF signals $IF_I$ and $IF_Q$ are summed and the summed signal is input to a pair of multipliers 55a, 55b or mixers. (Note that, in the preferred embodiment which employs a DSP, the complex multiplier 54 is a digital circuit.) The summed signal is multiplied (by multiplier 55a) as shown in FIG. 4B, by a signal of the form sine ωt (where ω is equal to 2Π times 15 kHz) to produce the in-phase baseband signal I. Similarly, the summed signal is multiplied (by the multiplier 55b) by cosine ωt to produce the quadrature-phase signal Q.

Another embodiment of the complex multiplier 54 (of FIG. 4A) is depicted in FIG. 4C, which also depicts a slightly modified embodiment 40' of the DSP 40 (shown in FIG. 2 and 4A). The DSP 40' shown in FIG. 4C differs from the embodiment of FIG. 4A only in the manner in which the complex multiplier 54 is coupled to the phase and amplitude correcting means.

As shown in FIG. 4C, the in-phase IF signal $IF_I$ is input to a pair of multipliers 44b and 44c. The quadrature-phase IF signal $IF_Q$, after it has been scaled by scaler 48, is input to another pair of multipliers 44d and 44e. Multiplier 44b multiplies $IF_I$ by a signal of the form sine (ωt+phi), where "phi" is equal to the phase error output by a integrator 46a. Multiplier 44c multiplies $IF_I$ by cosine (ωt+phi). The signals sine (ωt+phi) and cosine (ωt+phi) are provided by direct digital synthesizers (DDS elements) 56a and 56b, respectively. (The DDS elements are well known in the art. They typically include a phase accumulator, arithmetic and logic unit (ALU), and a ROM lookup table constructed and arranged to generate the necessary sine and cosine digital waveforms.) In a similar fashion, $IF_Q$ (as scaled by scaler 48) is multiplied by multipliers 44d and 44e by cosine ωt and sine ωt, respectively, provided by DDS element 56c. The outputs of multipliers 44b and 44e are provided as inputs to a summing device 52b, and an output of the summing device 52b is provided as an input to lowpass filter 54b. The output of the filter 54b is the quadrature-phase baseband signal Q. Similarly, the outputs of multipliers 44c and 44d are provided as inputs to a summing device 52c, and the output of this device is provided to a lowpass filter 54a. The output of filter 54a is the in-phase baseband signal I.

Once the baseband signals I and Q have been obtained as described above, they are fed to an FM demodulator or discriminator to obtain a single baseband signal, which may be used to provide an audio signal, such as a voice signal transmitted over a cellular voice channel. A receiver in accordance with the present invention is particularly suited for use in combination with an FM discriminator (a type of demodulator) that produces an FM signal in accordance with the equation:

$$FM = \frac{IdQ - QdI}{I^2 + Q^2}.$$

(It should be noted that other specific types of FM demodulator could be used as well. One example is an arctan (inverse tangent) discriminator.)

Figure 6:
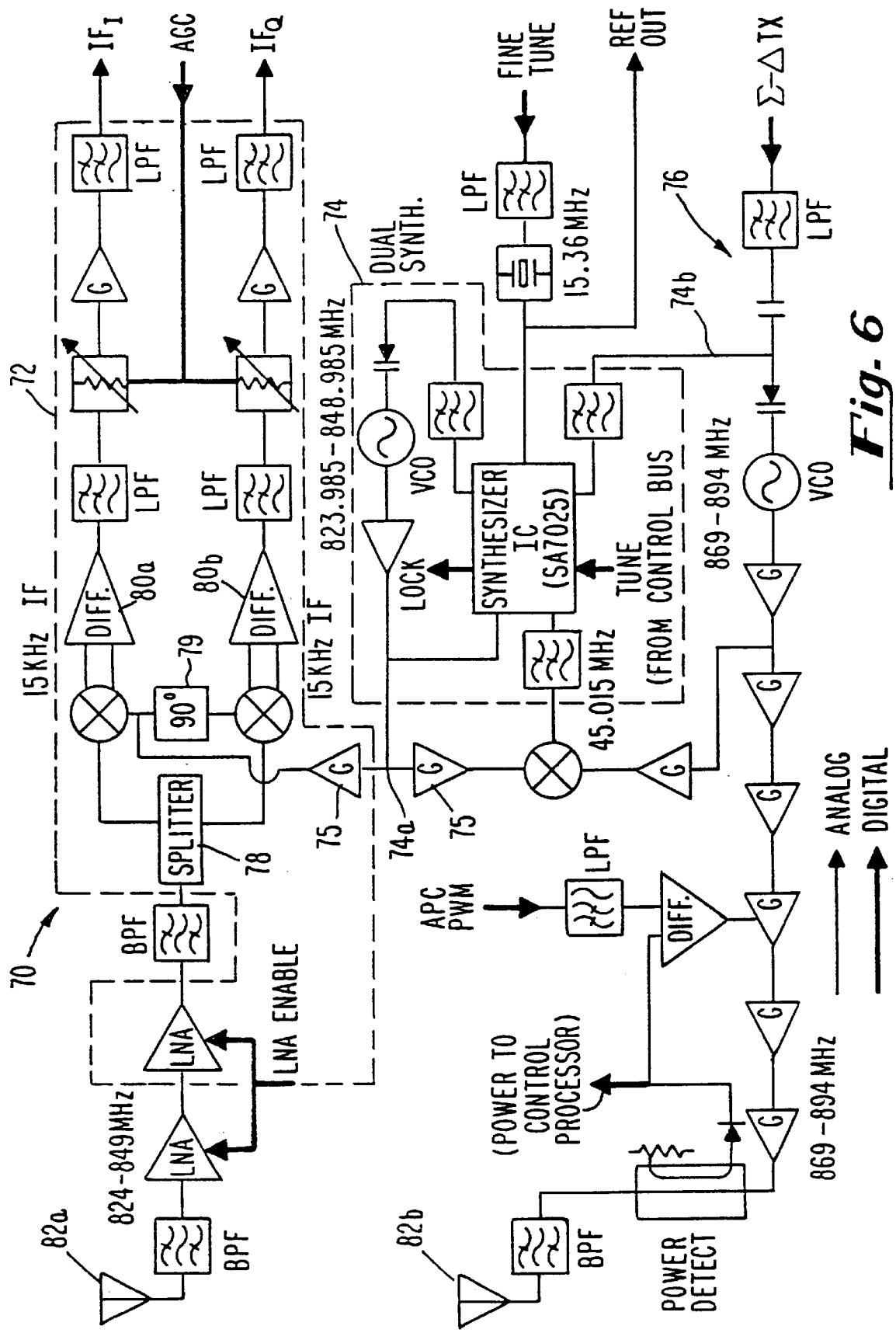
FIG. 6 schematically depicts a presently preferred embodiment of a transceiver in accordance with the present invention.

FIG. 6 schematically depicts a portion of a transceiver 70 in accordance with the present invention. (Note that the DSP 40 (of FIG. 2 and 4A) is not shown in FIG. 6.) The transceiver 70 includes a receiver section 72, a dual synthesizer 74, and a transmitter section 76. The dual synthesizer 74 provides a downconversion LO signal (e.g., in the range 823.985 to 848.985 MHz) on a line 74a. This downconversion signal is employed by the receiver section 72 as described above and explained in more detail below. The dual synthesizer 74 also provides an upconversion signal (e.g., in the range 869 to 894 MHz) on a line 74b. The upconversion signal is employed by the transmitter section 76.

The embodiment of the transceiver 70 shown in FIG. 6 includes an antennae 82a coupled via a bandpass filter (BPF), one or more low noise amplifiers (LNAs) and a signal splitter 78 to a quadrature mixer. The quadrature mixer mixes the received RF signal with the downconversion LO signal provided via line 74a and one or more amplifiers 75 (which are labelled "G") to a first mixer, and via a 90° phase shifter 79 to a second mixer. The two mixers of the quadrature mixer provide differential outputs to a pair of differential amplifiers (e.g., operational amplifiers) 80a and 80b. The outputs of the differential amplifiers 80a, 80b are provided to lowpass filters, controlled attenuators, and gain amplifiers (G) as shown. The outputs of the final lowpass filtering stage are the IF signals $IF_I$ and $IF_Q$. The controlled attenuators are controlled via an automatic gain control (AGC) signal in a manner which does not relate to the present invention.

The transmitter section 76 includes lowpass and bandpass filters, a number of gain amplifiers (G), as needed, and a voltage controlled oscillator (VCO) and power detector, which are common elements in transmitters. The upconversion LO signal provided by the dual synthesizer 74 is coupled to the input of the VCO as shown. The power detector provides a sample of the transmitter's output power to a control processor (not shown), which employs this signal to provide a power control signal (denoted "APC PWM") for use in controlling the gain of the gain amplifiers (G).

A fine tuning signal ("FINE TUNE") may be, but is not required to be, used to drive a crystal VCO to cause the crystal VCO to provide a 15.36 MHz reference signal (see the signal "REF OUT"), which is used by a synthesizer IC (e.g., an SA7725 IC) to generate the desired upconversion and downconversion LO signals. As shown, the synthesizer IC also receives a tuning signal ("TUNE") and provides a lock signal ("LOCK").

The structural and functional details of the transceiver 70 not described herein will be apparent to those skilled in the art. The present invention relates to the advantageous feature of the transceiver's use of two antennae 82a, 82b and its avoidance of the use of a diplexer, which can be relatively expensive. Another advantageous feature of the transceiver 70 is that it employs a single synthesizer 74 to provide the upconversion and downconversion signals for the receiver and transmitter sections, respectively.

Those skilled in the art will recognize that the invention disclosed herein may be implemented in embodiments other than the particular presently preferred embodiments described above. Accordingly, the scope of protection of the following claims is not intended to be limited to the above-described preferred embodiments.

We claim:

1. A receiver including:
   (a) a downconversion means for receiving a radio frequency (RF) signal and downconverting said RF signal to an in-phase intermediate frequency (IF) signal ($IF_I$) and a quadrature-phase IF signal ($IF_Q$); and
   (b) processing means, operatively coupled to said downconversion means, and including a pair of analog-to-digital converters for digitizing the $IF_I$ and $IF_Q$ signals, and a digital signal processor (DSP), operatively coupled to said analog-to-digital converters, for correcting the digitized IF signals ($IF_I$, $IF_Q$) so that they are substantially equal in magnitude and substantially 90° out of phase, and then downconverting said digitized IF signals to baseband signals (I, Q), wherein said DSP includes phase correcting means including:
      (1) a phase shifter for phase shifting at least one of said IF signals and providing as a phase shifter output phase shifted representations of said at least one of said IF signals;
      (2) a multiplier, operatively coupled to said phase shifter, for multiplying said IF signals and providing as a multiplier output product signals representing products of said IF signals; and
      (3) an integrator, operatively coupled to said multiplier and said phase shifter, for summing said product signals, providing sum signals representing cumulative sums of said product signals, and feeding said sum signals back to said phase shifter;

wherein said phase shifter shifts the phase of said at least one of said IF signals so as to minimize any error in the quadrature-phase relationship between the $IF_I$ and $IF_Q$ signals, wherein said RF signal is downconverted to an intermediate frequency of approximately one-half the channel spacing of the RF signal.

2. A receiver as recited in claim 1, wherein said DSP comprises a complex multiplier for downconverting said IF signals to said baseband signals (I, Q).

3. A receiver as recited in claim 1, wherein said downconversion means comprises:
   a signal splitter for splitting said RF signal and providing a pair of substantially identical RF signals; and
   a quadrature mixer, operatively coupled to said signal splitter, for downconverting said substantially identical RF signals and providing said in-phase and quadrature-phase IF signals ($IF_I$, $IF_Q$).

4. A receiver as recited in claim 1, wherein said RF signal is downconverted to an IF in the range 10–20 kHz.

5. A receiver as recited in claim 1, wherein said RF signal is downconverted to an IF of approximately 15 kHz.

6. A receiver as recited in claim 1, wherein said RF signal is downconverted to an IF in the range 10–20 kHz; wherein said receiver is constructed and arranged to receive frequency modulated (FM) signals; and wherein said downconversion means comprises a signal splitter for splitting said RF signal and providing a pair of substantially identical RF signals, and a quadrature mixer, operatively coupled to said signal splitter, for downconverting said substantially identical RF signals and providing said in-phase and quadrature-phase IF signals ($IF_I$, $IF_Q$).

7. A receiver including:
   (a) a downconversion means for receiving a radio frequency (RF) signal and downconverting said RF signal to an in-phase intermediate frequency (IF) signal ($IF_I$) and a quadrature-phase IF signal ($IF_Q$); and
   (b) processing means, operatively coupled to said downconversion means, and including a pair of analog-to-digital converters for digitizing the $IF_I$ and $I_Q$ signals, and a digital signal processor (DSP), operatively coupled to said analog-to-digital converters, for correcting the digitized IF signals ($IF_I$, $IF_Q$) so that they are substantially equal in magnitude and substantially 90° out of phase, and then downconverting said digitized IF signals to baseband signals (I, Q), wherein said DSP comprises an amplitude correcting means including:
      (1) scaling means for adjusting the magnitude of at least one of said IF signals; and
      (2) summing means, operatively coupled to said scaling means, for providing a sum signal representative of a sum of a difference, if any, in the magnitudes of said IF signals, and feeding said sum signal back to said scaling means;
   wherein said scaling means adjusts the magnitude of said at least one of said IF signals so as to minimize any difference in the magnitudes of said IF signals, and wherein said RF signal is downconverted to an intermediate frequency of approximately one-half the channel spacing of the RF signal.

8. A receiver, including:
   (a) a downconversion means for receiving a radio frequency (RF) signal and downconverting said RF signal to an in-phase intermediate frequency (IF) signal ($IF_I$) and a quadrature-phase IF signal ($IF_Q$); and
   (b) processing means, operatively coupled to said downconversion means, for digitizing said IF signals ($IF_I$, $IF_Q$), correcting said IF signals so that they are substantially equal in magnitude and substantially 90° out of phase, and then downconverting said IF signals to baseband signals (I, Q), wherein said RF signal is downconverted to an intermediate frequency of approximately one-half the channel spacing of the RF signal,
   wherein said receiver is constructed and arranged to receive frequency modulated (FM) signals, and further comprising an FM demodulator or discriminator for providing a demodulated baseband signal (FM) according to the equation:

$$FM = IdQ - QdI/I^2 + Q^2.$$

9. A receiver, including:
   (a) a downconversion means for receiving a radio frequency (RF) signal and downconverting said RF signal to an in-phase intermediate frequency (IF) signal ($IF_I$) and a quadrature-phase IF signal ($IF_Q$); and
   (b) processing means, operatively coupled to said downconversion means, and including a pair of analog-to-digital converters for digitizing the $IF_I$ and $IF_Q$ signals, and a digital signal processor (DSP), operatively coupled to said analog-to-digital converters, for correcting the digitized IF signals ($IF_I$, $IF_Q$) so that they are substantially equal in magnitude and substantially 90° out of phase, and then downconverting said digitized IF signals to baseband signals (I, Q), wherein said DSP comprises:
      (1) phase correcting means comprising a phase shifter for phase shifting at least one of said IF signals and providing as a phase shifter output phase shifted representations of said at least one of said IF signals; a multiplier, operatively coupled to said phase shifter, for multiplying said IF signals and providing as a multiplier output product signals representing products of said IF signals; and an integrator, operatively coupled to said multiplier and said phase shifter, for summing said product signals, providing sum signals representing cumulative sums of said product signals, and feeding said sum signals back to said phase shifter; wherein said phase shifter shifts the phase of said at least one of said IF signals so as to minimize any error in the quadrature-phase relationship between the $IF_I$ and $IF_Q$ signals; and
      (2) amplitude correcting means comprising scaling means for adjusting the magnitude of at least one of said IF signals; and summing means, operatively coupled to said scaling means, for providing a sum signal representative of a sum of a difference, if any, in the magnitudes of said IF signals, and feeding said sum signal back to said scaling means; wherein said scaling means adjusts the magnitude of said at least one of said IF signals so as to minimize any difference in the magnitudes of said IF signals;
   wherein said RF signal is downconverted to an intermediate frequency of approximately one-half the channel spacing of the RF signal.

10. A receiver as recited in claim 9, wherein said RF signal is downconverted to an IF of approximately 15 kHz.

11. A receiver as recited in claim 10, where in said DSP further comprises a complex multiplier for downconverting said IF signals to said baseband signals (I, Q).

12. A method for receiving and downconverting a radio frequency (RF) signal, comprising the steps of:

(a) receiving said RF signal;

(b) downconverting said RF signal to an in-phase intermediate frequency (IF) signal ($IF_I$) and a quadrature-phase IF signal ($IF_Q$);

(c) digitizing said IF signals ($IF_I$, $IF_Q$);

(d) correcting said IF signals so that they are substantially equal in magnitude and substantially 90° out of phase by:

(1) phase shifting at least one of said IF signals and providing phase shifted representations of said at least one of said IF signals;

(2) multiplying said IF signals and providing product signals representing products of said IF signals; and (3) summing said product signals and providing sum signals representing cumulative sums of said product signals, and employing said sum signals as feedback signals in said phase shifting step; wherein said phase shifting step shifts the phase of said at least one of said IF signals so as to minimize any error in the quadrature-phase relationship between the $IF_I$ and $IF_Q$ signals;

(e) downconverting said IF signals to baseband signals (I, Q), wherein said RF signal is downconverted to an intermediate frequency of approximately one-half the channel spacing of the RF signal.

13. A method as recited in claim 12, wherein steps (d) and (e) are performed by a digital signal processor (DSP).

14. A method as recited in claim 13, wherein said DSP is employed for:

(1) phase shifting at least one of said IF signals and providing phase shifted representations of said at least one of said IF signals; multiplying said IF signals and providing product signals representing products of said IF signals; and summing said product signals, providing sum signals representing cumulative sums of said product signals, and employing said sum signals as feedback signals in said phase shifting; wherein said phase shifting step shifts the phase of said at least one of said IF signals so as to minimize any error in the quadrature-phase relationship between the $IF_I$ and $IF_Q$ signals; and (2) adjusting the magnitude of at least one of said IF signals; and providing a sum signal representative of a sum of a difference, if any, in the magnitudes of said IF signals, and employing said sum signal as a feedback signal in the adjusting step; wherein said adjusting step adjusts the magnitude of said at least one of said IF signals so as to minimize any difference in the magnitudes of said IF signals.

15. A method as recited in claim 14, wherein said RF signal is downconverted to an IF of approximately 15 kHz.

16. A method as recited in claim 14, wherein said DSP is further employed for performing a complex multiplication to downconvert said IF signals to said baseband signals (I, Q).

17. A method as recited in claim 12, wherein step (e) comprises downconverting said IF signals to said baseband signals (I, Q) by performing a complex multiplication of said IF signals by a pair of digital sinewaves having a frequency substantially equal to the IF frequency.

18. A method as recited in claim 12, wherein said method is employed to receive frequency modulated (FM) signals, and further comprising the step of demodulating or discriminating said baseband signals (I, Q) to provide a demodulated baseband signal (FM) according to the equation:

$$FM = \frac{IdQ - QdI}{I^2 + Q^2}.$$

19. A method as recited in claim 12, wherein step (b) comprises:

splitting said RF signal and providing a pair of substantially identical RF signals; and downconverting said substantially identical RF signals and providing said in-phase and quadrature-phase IF signals ($IF_I$, $IF_Q$).

20. A method as recited in claim 12, wherein said RF signal is downconverted to an IF in the range 10–20 kHz.

21. A method as recited in claim 12, wherein said RF signal is downconverted to an IF of approximately 15 kHz.

22. A method as recited in claim 12, wherein said RF signal is downconverted to an IF in the range 10–20 kHz; wherein said method is employed to receive frequency modulated (FM) signals; and wherein step (b) comprises splitting said RF signal and providing a pair of substantially identical RF signals, and downconverting said substantially identical RF signals to provide said in-phase and quadrature-phase IF signals ($IF_I$, $IF_Q$).

23. A method for receiving and downconverting a radio frequency (RF) signal, comprising the steps of:

(a) receiving said RF signal;

(b) downconverting said RF signal to an in-phase intermediate frequency (IF) signal ($IF_I$) and a quadrature-phase IF signal ($IF_Q$);

(c) digitizing said IF signals ($IF_I$, $I_Q$);

(d) correcting said IF signals so that they are substantially equal in magnitude and substantially 90° out of phase by:

(1) adjusting the magnitude of at least one of said IF signals; and (2) providing a sum signal representative of a sum of a difference, if any, in the magnitudes of said IF signals, and employing said sum signal as a feedback signal in said adjusting step; wherein said adjusting step adjusts the magnitude of said at least one of said IF signals so as to minimize any difference in the magnitudes of said IF signals;

(e) downconverting said IF signals to baseband signals (I, Q), wherein said RF signal is downconverted to an intermediate frequency of approximately one-half the channel spacing of the RF signal.

24. A transceiver for receiving first radio frequency (RF) signals in a first set of frequency channels and transmitting second RF signals in a second set of frequency channels without the use of a diplexer, comprising:

(a) a receiver comprising downconversion means for downconverting said first RF signals to in-phase intermediate frequency (IF) signals ($IF_I$) and quadrature-phase IF signals ($IF_Q$); analog-to-digital conversion means for digitizing said IF signals; and processing means including a digital signal processor (DSP), operatively coupled to said analog-to-digital conversion means, for correcting the digitized IF signals ($IF_I$, $IF_Q$) so that they are substantially equal in magnitude and substantially 90° out of phase and then downconverting said digitized IF signals to baseband signals (I, Q), wherein said DSP comprises phase correcting means including:

(1) a phase shifter for phase shifting at least one of said IF signals and providing as a phase shifter output phase shifted representations of said at least one of said IF signals;

(2) a multiplier, operatively coupled to said phase shifter, for multiplying said IF signals and providing as a multiplier output product signals representing products of said IF signals; and (3) an integrator, operatively coupled to said multiplier and said phase shifter, for summing said product signals, providing sum signals representing cumulative sums of said product signals, and feeding said sum signals back to said phase shifter;

wherein said phase shifter shifts the phase of said at least one of said IF signals so as to minimize any error in the quadrature-phase relationship between $IF_I$ and $IF_Q$;

(b) a transmitter comprising means for upconverting second baseband signals to said second RF signals;

(c) a synthesizer operatively coupled to said receiver and transmitter for providing a downconversion local oscillator (LO) signal to said receiver and an upconversion LO signal to said transmitter;

(d) a first antenna operatively coupled to said receiver for receiving said first RF signals; and (e) a second antenna operatively coupled to said transmitter for transmitting said second RF signals, wherein said RF signal is downconverted to an intermediate frequency of approximately one-half the channel spacing of the RF signal.

25. A transceiver as recited in claim 24, wherein said DSP comprises a complex multiplier for downconverting said IF signals to said baseband signals (I, Q).

26. A transceiver as recited in claim 24, wherein said receiver is constructed and arranged to receive frequency modulated (FM) signals, and further comprising an FM demodulator or discriminator for providing a demodulated baseband signal (FM) according to the equation:

$$FM = \frac{IdQ - QdI}{I^2 + Q^2}.$$

27. A transceiver as recited in claim 24, wherein said downconversion means comprises:

a signal splitter for splitting said first RF signals and providing a pair of substantially identical RF signals; and a quadrature mixer, operatively coupled to said signal splitter, for downconverting said substantially identical RF signals and providing said in-phase and quadrature-phase IF signals ($IF_I$, $IF_Q$).

28. A transceiver as recited in claim 24, wherein said first RF signals are downconverted to an IF in the range 10–20 kHz.

29. A transceiver as recited in claim 24, wherein said first RF signals are downconverted to an IF of approximately 15 kHz.

30. A transceiver as recited in claim 24, wherein said RF signals are downconverted to an IF in the range 10–20 kHz; wherein said receiver is constructed and arranged to receive frequency modulated (FM) signals; and wherein said downconversion means comprises a signal splitter for splitting said first RF signals and providing a pair of substantially identical RF signals, and a quadrature mixer, operatively coupled to said signal splitter, for downconverting said substantially identical RF signals and providing said in-phase and quadrature-phase IF signals ($IF_I$, $IF_Q$).

31. A transceiver, for receiving first radio frequency (RF) signals in a first set of frequency channels and transmitting second RF signals in a second set of frequency channels without the use of a diplexer, including:

(a) a receiver comprising downconversion means for downconverting said first RF signals to in-phase intermediate frequency (IF) signals ($IF_I$) and quadrature-phase IF signals ($IF_Q$); analog-to-digital conversion means for digitizing said IF signals; and processing means including a digital signal processor (DSP), operatively coupled to said analog-to-digital conversion means, for correcting the digitized IF signals ($IF_I$, $I_Q$) so that they are substantially equal in magnitude and substantially 90° out of phase, and then downconverting said digitized IF signals to baseband signals (I, Q), wherein said DSP comprises an amplitude correcting means including:

(1) scaling means, for adjusting the magnitude of at least one of said IF signals; and (2) summing means, operatively coupled to said scaling means, for providing a sum signal representative of a sum of a difference, if any, in the magnitudes of said IF signals, and feeding said sum signal back to said scaling means;

wherein said scaling means adjusts the magnitude of said at least one of said IF signals so as to minimize any difference in the magnitude of said IF signals;

(b) a transmitter comprising means for upconverting second baseband signals to said second RF signals;

(c) a synthesizer operatively coupled to said receiver and transmitter for providing a downconversion local oscillator (LO) signal to said receiver and an upconversion LO signal to said transmitter;

(d) a first antenna operatively coupled to said receiver for receiving said first RF signals; and (e) a second antenna operatively coupled to said transmitter for transmitting said second RF signals.

32. A transceiver for receiving first radio frequency (RF) signals in a first set of frequency channels and transmitting second RF signals in a second set of frequency channels without the use of a diplexer, comprising:

(a) a receiver comprising downconversion means for downconverting said first RF signals to in-phase intermediate frequency (IF) signals ($IF_I$) and quadrature-phase IF signals ($IF_Q$); analog-to-digital conversion means for digitizing said IF signals; and processing means including a digital signal processor (DSP), operatively coupled to said analog-to-digital conversion means, for correcting the digitized IF signals ($IF_I$, $I_Q$) so that they are substantially equal in magnitude and substantially 90° out of phase, and then downconverting said digitized IF signals to baseband signals (I, Q), wherein said DSP includes:

(1) phase correcting means comprising a phase shifter for phase shifting at least one of said IF signals and providing as a phase shifter output phase shifted representations of said at least one of said IF signals; a multiplier, operatively coupled to said phase shifter, for multiplying said IF signals and providing as a multiplier output product signals representing products of said IF signals; and an integrator, operatively coupled to said multiplier and said phase shifter, for summing said product signals, providing sum signals representing cumulative sums of said product signals, and feeding said sum signals back to said phase shifter; wherein said phase shifter shifts the phase of said at least one of said IF signals so as to minimize any error in the quadrature-phase relationship between $IF_I$ and $IF_Q$; and (2) amplitude correcting means comprising scaling means for adjusting the magnitude of at least one of said IF signals; and summing means, operatively coupled to said scaling means, for providing a sum signal representative of a sum of a difference, if any, in the magnitudes of said IF signals, and feeding said sum signal back to said scaling means; wherein said scaling means adjusts the magnitude of said at least one of said IF signals so as to minimize any difference in the magnitude of said IF signals;

(b) a transmitter comprising means for upconverting second baseband signals to said second RF signals;

(c) a synthesizer operatively coupled to said receiver and transmitter for providing a downconversion local oscillator (LO) signal to said receiver and an upconversion LO signal to said transmitter;

(d) a first antenna operatively coupled to said receiver for receiving said first RF signals; and (e) a second antenna operatively coupled to said transmitter for transmitting said second RF signals, wherein said RF signal is downconverted to an intermediate frequency of approximately one-half the channel spacing of the RF signal.

33. A transceiver as recited in claim 32, wherein said first RF signals are downconverted to an IF of approximately 15 kHz.

34. A transceiver as recited in claim 32, wherein said DSP further comprises a complex multiplier for downconverting said IF signals to said baseband signals (I, Q).

* * * * *